United States Patent [19]
Pasen et al.

[11] Patent Number: 5,459,085
[45] Date of Patent: Oct. 17, 1995

[54] GATE ARRAY LAYOUT TO ACCOMMODATE MULTI ANGLE ION IMPLANTATION

[75] Inventors: Nicholas F. Pasen, Pacifica; Aldona M. Butkus, Santa Clara; Sheldon Aronowitz, San Jose, all of Calif.

[73] Assignee: LSI Logic Corporation, Milpitas, Calif.

[21] Appl. No.: 242,246

[22] Filed: May 13, 1994

[51] Int. Cl.$^6$ ................................. H01L 21/265
[52] U.S. Cl. ................. 437/35; 437/51; 437/48; 437/50; 257/203; 257/202
[58] Field of Search .................. 437/35, 51, 48, 437/50; 257/202, 203

[56] References Cited

U.S. PATENT DOCUMENTS

| | | | |
|---|---|---|---|
| 4,733,288 | 3/1988 | Sato | 257/203 |
| 4,771,012 | 9/1988 | Yabu et al. | 437/35 |
| 4,853,757 | 8/1989 | Kuramitsu et al. | |
| 5,040,035 | 8/1991 | Gabara et al. | |

FOREIGN PATENT DOCUMENTS

| | | |
|---|---|---|
| 61-198650 | 9/1986 | Japan. |
| 2-87550 | 3/1990 | Japan. |

Primary Examiner—Brian E. Hearn
Assistant Examiner—Lynne A. Gurley
Attorney, Agent, or Firm—Poms, Smith, Lande & Rose

[57] ABSTRACT

A transistor gate array includes an active transistor region (50a–50n) of transistor gates all oriented in a single direction. Surrounding the active transistor region on all four sides are input/output regions (52a–52d) each containing a row of input/output transistors. All of the I/O devices on all sides of the array are oriented in the same common direction, which is the same direction as the orientation of the active transistor in the active region. This arrangement allows the use of the benefits of high angle ion implantation with fewer ion implant steps. Where some of the transistors are oriented at right angles to others, as in the prior art, four separate directions of high angle ion implantation are required to avoid degradation of electrical properties. With all transistors, including those of the gate array and those of the input/output devices, all oriented in the same direction, only two directions of high angle ion implantation are required.

1 Claim, 1 Drawing Sheet

GATE ARRAY LAYOUT TO ACCOMMODATE MULTI ANGLE ION IMPLANTATION

BACKGROUND OF THE INVENTION

1. Field of the Invention

The present invention relates to large scale arrays of transistors, and more particularly concerns an improved arrangement of active devices in a very large scale integrated circuit configured to maximize the advantages of high angle ion implantation.

2. Description of Related Art

Very large scale integrated circuit dies typically contain large numbers of submicron transistors manufactured by multi-step procedures that include the laying down of different layers of conductive and non-conductive materials, masking and selective removal of portions of deposited layers. Selected portions of the die are typically doped with impurities to provide areas of n-type and p-type regions and to form the active devices. Implantation of impurities by use of high angle ion implantation methods are known in the integrated circuit fabrication arts to provide a number of benefits.

Typically, very large scale integrated circuits are made with a central active region in which all of the central active devices are oriented in the same direction. Positioned around the periphery of the active region, usually on all four sides thereof, are rows of input output transistors. In prior art systems the input output devices are oriented in each of two mutually orthogonal directions, with the input output devices of the rows at the top and bottom of the active array, for example, being oriented in one direction and the input/output devices of the row at the left side and the row at the right side of the array being oriented in a perpendicular direction. Typically the input/output devices are oriented parallel to the edge of the integrated circuit die to which they are adjacent. With this input/output arrangement a quadrature ion implant is normally employed in order form the input/output devices. In quadrature high angle ion implantation the wafer on which the various arrays are being formed is tilted to the vertical by an angle on the order of greater than 0° to about 60°, preferably 7° to 45° and a vertically directed beam of ions are directed at the wafer. Upon completion of a first ion implant, the wafer is turned 90° and a second high angle ion implantation step is performed. The wafer is then again turned 90° a third and a fourth time, each time performing a high angle implantation, to ensure that all sides of the variously oriented transistors are subject to symmetrical ion implantation and to ensure that no parts of the devices are effectively in the shadow of raised portions of the device.

Each ion implantation step requires a finite time, and thus increased time of production results. Additionally, high angle implantation directed at the side of an active device, instead of along a line drawn from a device source to a device drain, can cause degradation of electrical properties of the field oxide edge. The quadrature orientation of the input/output devices, however, typically results in at least some high angle implantation along undesirable orientations. Accordingly, it is an object of the present invention to provide a gate array layout that significantly improves high angle ion implantation procedures.

SUMMARY OF THE INVENTION

In carrying out principles of the present invention in accordance with a preferred embodiment thereof, an integrated circuit comprising a substrate having a plurality of active devices in a control active region along with input/output regions formed, wherein an array of active semiconductor devices in the central region and a plurality of input/output devices in the input/output regions are similarly oriented. Thus all of the input/output devices in the input/output regions of the integrated circuit and active devices have in the central active region of the integrated circuit have their contacts aligned along a single axis so that the orientation of all of the active devices and all of the input/output devices is generally the same, regardless of their position on the integrated circuit. Since only a single orientation of all of the transistors, including active transistors and input/output devices is employed, only two directions of angle implantation need be employed, thus eliminating the need for high angle ion implantation steps along axes perpendicular to the source-drain orientations of the active devices.

DETAILED DESCRIPTION OF THE PREFERRED EMBODIMENTS

Figure 1:
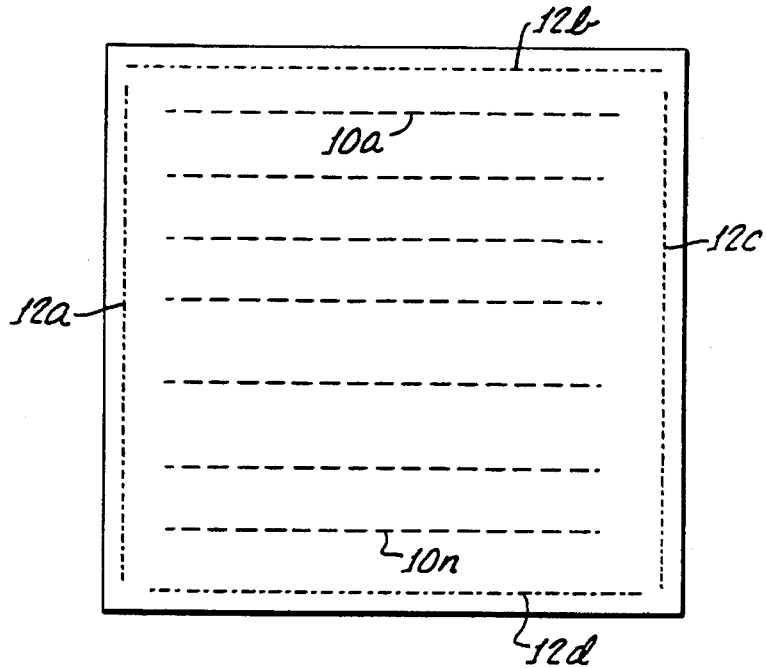
FIG. 1 illustrates a conventional very large scale device integrated circuit device.

In a conventional integrated circuit illustrated in FIG. 1, the arrangement of active devices in a central region and in peripheral input/output regions along each side of the die is shown. The rows of dashed lines, such as 10a through 10n, represent lines of similarly oriented transistors, each including a source and drain with a gate interposed between the two. In these discussions it is convenient to designate the vertical direction of the drawings as the Y axis and the horizontal direction as the X axis. Thus, the orientations of all the transistors in the lines 10a through 10n are the same, being generally oriented along the X axis. Surrounding the central region of the integrated circuit are rows 12a through 12d of input/output devices, each extending along one side or the top or bottom of the central region, or core array, 10a through 10n. The input/output transistors on the left and right sides of the core array, that is transistor rows 12a and 12c, are oriented with respect to one another such that a line from the source to the drain contacts of the individual transistors extends along the Y axis, or vertically in such conventional arrangements. The input/output devices at the top and bottom, in rows 12b and 12d of conventional integrated circuits, however, are oriented with their source to drains aligned along the X axis.

Figure 2:
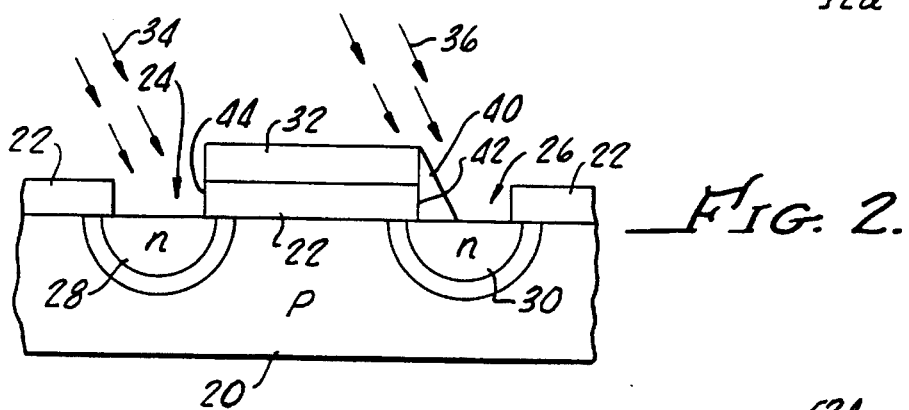
FIG. 2 is a simplified section of a single device illustrating high angle implantation.

In the course of the various steps of forming the active transistors, impurities are implanted in different layers by various procedures, including high angle implantation. FIG. 2 is illustrative of some of the steps performed in the manufacture of, for example, a conventional field effect transistor. A p-type substrate 20 is coated with a non-conductive field oxide 22 that is etched to form open areas 24,26 between portions of the oxide. The p-type substrate 20 is then subjected to an appropriate beam of ions for implantation of n-type impurities to provide n-type regions forming a source region 28 and drain region 30 of the device. A gate 32 contact is also formed over a central portion of field oxide layer 22 between the source 28 and drain 30. The device orientation may be characterized by a line from the source to the drain. In FIG. 2 the high angle ion implantation is indicated by arrows 34,36, which show an exaggerated large angle of ion implantation, in actual practice the ion beams may be closer to a perpendicular to the surface of the device. It will be seen that an area, indicated by the shaded area 40, is effectively in the shadow of the gate at central oxide layer 22. As a consequence portions of the drain region 30 are not exposed to the angled ion beam, nor are portions of the side edges 42 of the central oxide layer. On the other hand, sides 44 of the central oxide layer are subject to the ion implantation beam so that there is lack of symmetry in the effective overall implantation. To avoid this lack of symmetry the angle of the beam is changed relative to the substrate, or more specifically and simply, the substrate is rotated 180° and the ion beam is again directed at the substrate. This time, in the reversed orientation, the shaded area 40 is not in shadow and the side 42 of the central oxide layer 22 is exposed to the ion beam. In this reversed orientation, of course, the other side of the central oxide layer 22 and the source 28 are subject to the shadowing described in connection with the initial beam orientation. Accordingly, it will be seen that for any single orientation (direction of a line from source to drain) of an active device two different angles of ion implantation and two separate ion implantation steps are generally employed, each occurring over a finite period of time. In conventional integrated circuits, where active devices are oriented in different directions, some being oriented at right angles to one another, a quadrature ion implant procedure is normally required to ensure that all devices are symmetrically exposed.

Figure 3:
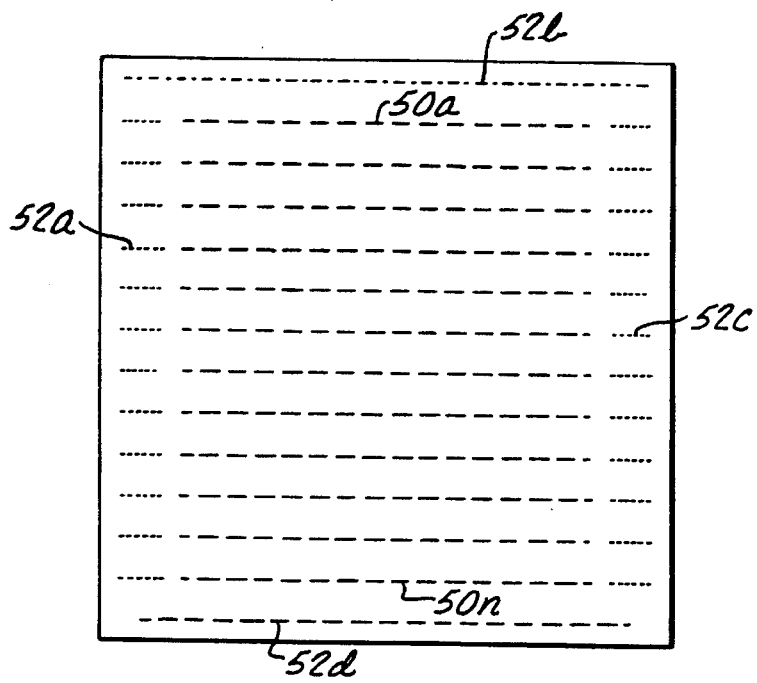
FIG. 3 illustrates the layout configuration of an integrated circuit device embodying principles of the present invention.

In accordance with principles of the present invention, to improve and simplify the manufacturing procedure of such arrays of submicron devices or transistors, the active devices and input/output devices of the array are arranged such as illustrated in FIG. 3. Thus, in FIG. 3 there is a central core or array region of active devices including a plurality of lines 50a through 50n of active transistors all oriented along a single axis such as, for example, the X axis. In addition, peripheral input/output rows or regions, including regions 52a,52b,52c and 52d are also provided.

In accordance with the present invention, the input/output devices of regions 52a,52b,52c and 52d are all oriented in the same direction as the transistors in the core array, for example parallel to the X axis, and therefore all of the transistors of the integrated circuit are oriented in the same direction. Thus, in accordance with the present invention a preferred embodiment of which is illustrated in FIG. 3, all of the devices within the core region, including devices 50a through 50n, are oriented parallel to an axis such as, for example, the X axis and similarly of the input/output devices at the top and bottom input/output regions 52b and 52d are also oriented parallel to the same axis. Moreover, all of the devices in input/output regions 52a,52c that extend along the left and right sides of the central core array are also all oriented parallel to the same axis such as the X axis as illustrated in FIG. 3. With this arrangement merely a two step or two angle ion implantation is all that is sufficient to accomplish proper ion implantation with complete symmetry. Also importantly, degradation of electrical properties of the field oxide edge resulting from perpendicular ion bombardment at high angles of ion implantation are avoided. This simple rearrangement or orientations of certain of the input/output transistors eliminates two high angle ion implantation steps and greatly reduces manufacturing time.

It will, of course, be understood that various modifications and additions can be made to the preferred embodiment of the present invention discussed above without departing from the scope or spirit of the invention. The present invention, including the alignment of input/output devices parallel to a single axis, is suitable for use in a variety of applications. For example, any high angle implementation across a full range of implant orientations from greater than 0° to angles of 75° and even up to approximately 90° may be used in connection with the present invention and benefit therefrom. Accordingly, the scope of the present invention should not be limited by the particular embodiments discussed above, but should be defined only by the claims set forth below and equivalents thereof.

We claim:

1. A method of forming an array of semiconductor gates comprising the steps of:

providing a substrate having at least one gate region bordered by an I/0 region, forming an array of active transistors in said gate region each having a source and drain defining an active transistor orientation, forming a plurality of I/O transistors in said I/O region each having a source and drain defining an I/0 transistor orientation, both said steps of forming comprising forming all of said active transistor and I/0 transistor orientations the same as each other, with orientations of all of said active transistors the same as all of said I/0 transistor orientations, and all of said orientations extending parallel to an axis, directing a first ion implantation beam at an angle to and toward said substrate in a first direction parallel to said axis, and directing a second ion implantation beam at an angle to and toward said substrate in a second direction opposite said first direction and parallel to said axis, whereby ion implantation is completed with implantation beams in only two directions.

* * * * *